United States Patent
Byun et al.

(10) Patent No.: US 7,312,470 B2
(45) Date of Patent: Dec. 25, 2007

(54) THIN FILM TRANSISTOR ARRAY PANEL AND METHOD FOR FABRICATING THE SAME

(75) Inventors: Jae-Seong Byun, Suwon (KR); Kun-Jong Lee, Seoul (KR); Hyun-Su Lim, Suwon (KR); Jong-Hwan Cha, Kyungki-do (KR); Bae-Hyoun Jung, Yongin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 134 days.

(21) Appl. No.: 10/481,236

(22) PCT Filed: Jun. 20, 2002

(86) PCT No.: PCT/KR02/01174

§ 371 (c)(1),
(2), (4) Date: Sep. 1, 2004

(87) PCT Pub. No.: WO03/001606

PCT Pub. Date: Jan. 3, 2003

(65) Prior Publication Data
US 2005/0012150 A1 Jan. 20, 2005

(30) Foreign Application Priority Data
Jun. 21, 2001 (KR) .............................. 2001-35303

(51) Int. Cl.
*H01L 29/04* (2006.01)
(52) U.S. Cl. .................................. 257/59; 257/359
(58) Field of Classification Search ................. 349/43, 349/141, 187, 42; 257/59, 72, 359, E51.005; 438/30
See application file for complete search history.

(56) References Cited

U.S. PATENT DOCUMENTS

| 4,345,249 A | 8/1982 | Togashi ........................ 340/784 |
| 6,287,899 B1* | 9/2001 | Park et al. ................... 438/149 |
| 6,493,048 B1* | 12/2002 | Baek et al. ................... 349/43 |

(Continued)

FOREIGN PATENT DOCUMENTS

| JP | 03-102324 | 4/1991 |
| JP | 07-134314 | 5/1995 |

(Continued)

OTHER PUBLICATIONS

English Abstract for Publication No. 09-312334.

(Continued)

*Primary Examiner*—Nathan W. Ha
(74) *Attorney, Agent, or Firm*—F. Chau & Associates, LLC

(57) ABSTRACT

The present invention relates to a TFT array panel and a fabricating method thereof. A gate insulating layer and a passivation layer are formed by printing organic insulating material in order to simplify the fabricating process. The inventive TFT panel includes an insulating substrate, and a gate wire formed on the insulating substrate. The gate wire includes a gate line and a gate pad connected to one end of the gate line. A gate insulating layer is formed on the insulating substrate while exposing the gate pad and a portion of the gate line close to the gate pad. A semiconductor pattern is formed on the gate insulating layer. A data wire is formed on the gate insulating layer. The data wire includes a data line, a source electrode connected to the data line, a drain electrode facing the source electrode and a data pad connected to one end of the data line. A passivation layer is formed on the gate insulating layer while exposing the data pad and a portion of the data line close to the data pad.

7 Claims, 14 Drawing Sheets

U.S. PATENT DOCUMENTS

Figure 1:
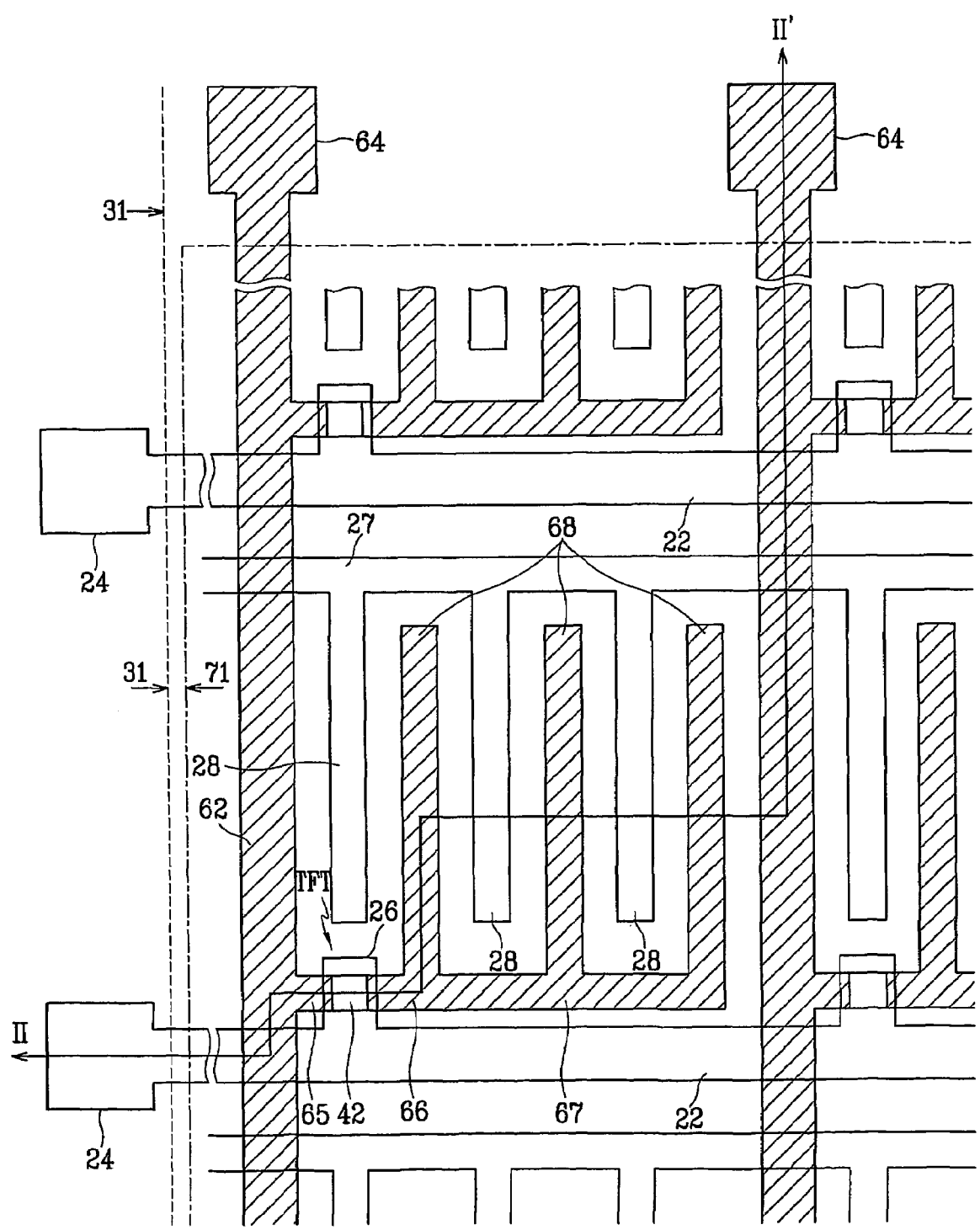

| | | | |
|---|---|---|---|
| 6,524,876 B1 * | 2/2003 | Baek et al. | 438/48 |
| 6,678,018 B2 * | 1/2004 | Park et al. | 349/43 |
| 6,696,324 B2 * | 2/2004 | Hong et al. | 438/149 |
| 7,102,160 B1 * | 9/2006 | Kwak | 257/57 |

FOREIGN PATENT DOCUMENTS

| | | |
|---|---|---|
| JP | 08-023101 | 1/1996 |
| JP | 09-101538 | 4/1997 |
| JP | 09-312334 | 12/1997 |
| JP | 1999-0045543 | 6/1999 |
| JP | 2000-150906 | 5/2000 |
| JP | 2001-075126 | 3/2001 |
| KR | 1999-0045543 | 6/1999 |
| KR | 1999-0083412 | 11/1999 |
| KR | 102000001758 | 1/2000 |
| KR | 2001-0037335 | 5/2001 |
| KR | 2001037334 A * | 5/2001 |

OTHER PUBLICATIONS

English Abstract for Publication No. 1999-0045543.
English Abstract for Publication No. 102000001758.
English Abstract for Publication No. 2000-150906.
English Abstract for Publication No.: 03-102324
English Abstract for Publication No.: 07-134314
English Abstract for Publication No.: 08-023101
English Abstract for Publication No.: 09-101538

* cited by examiner

THIN FILM TRANSISTOR ARRAY PANEL AND METHOD FOR FABRICATING THE SAME

BACKGROUND OF THE INVENTION (a) Field of the Invention

The present invention relates to a thin film transistor array panel and a fabricating method thereof and, more particularly, to a thin film transistor array panel for a liquid crystal display and a fabricating method thereof.

(b) Description of the Related Art

Currently, an LCD is one of the most widely used flat panel displays. An LCD, which includes two panels having electrodes and a liquid crystal layer interposed therebetween, controls the transmittance of light passing through the liquid crystal layer by re-arranging liquid crystal molecules in the liquid crystal layer with voltages applied to the electrodes.

One of the LCDs for improving viewing angle provides one of the two panels with linear electrodes parallel to each other and thin film transistors ("TFTs") for switching the voltages applied to the electrodes to re-arrange the liquid crystal molecules, which are initially aligned parallel to the panels.

The panel with the TFTs (referred to as the "TFT array panel" hereinafter) is usually fabricated by photo etch using several masks. Although the number of the currently used masks is five or six, it is required to decrease the number in order to reduce the production cost.

SUMMARY OF THE INVENTION

It is an object of the present invention to provide a TFT array panel and a fabricating method thereof, which involves simplified processing steps.

This and other objects may be achieved by forming a gate insulating layer or a passivation layer made of an organic insulating material by way of printing technique or slit-coating technique.

In detail, an inventive TFT array panel includes: an insulating substrate; a gate wire formed on the insulating substrate and including a gate line, and a gate pad connected to one end of the gate line; a gate insulating layer formed on the insulating substrate while exposing the gate pad and a portion of the gate line close to the gate pad; a semiconductor pattern formed on the gate insulating layer; a data wire formed on the gate insulating layer and including a data line intersecting the gate line, a source electrode connected to the data line and contacting the semiconductor pattern, a drain electrode facing the source electrodes and contacting the semiconductor pattern, and a data pad connected to one end of the data line; and a passivation layer formed on the gate insulating layer while exposing the data pad and a portion of the data line close to the data pad.

The TFT array panel may further include a common wire formed on the substrate and including a common electrode line parallel to the gate line, a common electrode connected to the common electrode line, and a common electrode pad connected to one end of the common electrode line, and the gate insulating layer preferably exposes the common electrode pad, and a portion of the common electrode line close to the common electrode pad. The gate insulating layer or the passivation layer is preferably made of an organic insulating material.

An inventive method of fabricating a TFT array panel includes: forming a gate wire on an insulating substrate, the gate wire including a gate line, and a gate pad connected to one end of the gate line; forming a gate insulating layer made of an organic insulating material on the insulating substrate such that the gate insulating layer exposes the gate pad and a portion of the gate line close to the gate pad; forming a semiconductor pattern on the gate insulating layer; forming a data wire on the gate insulating layer, the data wire having a data line intersecting the gate line, a source electrode connected to the data line and contacting the semiconductor pattern, a drain electrode facing the source electrode and contacting the semiconductor pattern, and a data pad connected to one end of the data line; and forming a passivation layer made of an organic insulating material on the gate insulating layer such that the passivation layer exposes the data pad and a portion of the data line close to the data pad. The formation of at least one of the gate insulating layer and the passivation layer is made by way of slit coating or printing.

The gate insulating layer may be surface-flattened after the formation of the gate insulating layer.

BRIEF DESCRIPTION OF THE DRAWINGS

FIG. 1 is a layout view of a TFT array panel according to an embodiment of the present invention;

FIG. 2 is a sectional view taken along the line II-II' shown in FIG. 1;

FIG. 3A is a layout view of a TFT array panel in the first step of fabricating method thereof;

FIG. 3B is a sectional view taken along the line IIIb-IIIb' shown in FIG. 3A;

FIG. 4A is a layout view of a TFT array panel in the step following FIG. 3A;

FIG. 4B is a sectional view taken along the line IVb-IVb' shown in FIG. 4A;

FIG. 5A is a layout view of a TFT array panel in the step following FIG. 4A;

FIG. 5B is a sectional view taken along the line Vb-Vb' shown in FIG. 5A;

FIGS. 6 to 9 sequentially illustrate the intermediate steps of fabricating the TFT array panel with a cross section shown FIG. 5B from the TFT array panel with a cross section shown in FIG. 4B;

FIG. 10 illustrates a gate insulating pattern made by the steps of fabricating a TFT array panel according to an embodiment of the present invention; and FIG. 11 illustrates a passivation layer pattern made by the steps of fabricating a TFT array panel according to an embodiment of the present invention.

DETAILED DESCRIPTION OF PREFERRED EMBODIMENTS

Now, methods of manufacturing a TFT array panel according to embodiments of the present invention will be described with reference to the accompanying drawings.

Hereinafter, the present invention will be described by way of an exemplary TFT array panel for an LCD driving liquid crystal using horizontal electric field for wide viewing angle.

FIG. 1 is a layout view of a TFT array panel according to an embodiment of the present invention, and FIG. 2 is a sectional view of the TFT array panel shown in FIG. 1 taken along the line II-II'.

As shown in FIGS. 1 and 2, a gate wire 22, 24 and 26 and a common wire 27 and 28 are formed on an insulating substrate 10. The gate wire 22, 24 and 26 includes a plurality of gate lines 22 extending in a transverse direction, a plurality of gate pads 24 connected to one ends of the gate lines 22 to transmit scanning signals thereto, and a plurality of gate electrodes 26 connected to the gate lines 22. The common wire 27 and 28 includes a plurality of common electrode lines 27 parallel to the gate lines 22 and transmitting common electrode signals (referred to as "common signals" hereinafter) from an external device, and a plurality of common electrodes 28 connected to the common electrode lines 27 and extending in a longitudinal direction.

It is preferable that the gate wire 22, 24 and 26 and the common wire 27 and 28 are made of a low resistivity metallic material. The gate wire 22, 24 and 26 and the common wire 27 and 28 have either a single-layered structure or a multiple-layered structure. The single-layered structure preferably includes Cr, Cr alloy, Mo, Mo alloy, Al, Al alloy, Ag, or Ag alloy. The double-layered structure includes one layer preferably made of a low resistivity metallic material, and the other layer preferably made of a material bearing a good contact characteristic with other materials.

A gate insulating layer 30 preferably made of an organic insulating material is formed on the insulating substrate 10. The gate insulating layer 30 covers the entire surface of the panel except for the gate pads 24. That is, the gate insulating layer 30 covers the gate lines 22, the gate electrodes 26 and the common wire 27 and 28, while exposing the gate pads 24.

The dotted line indicated by the reference numeral 31 in FIG. 1 refers to the peripheral boundaries of the gate insulating layer 30. It is preferable that the gate insulating layer 30 is made of a low dielectric material exhibiting excellent flattening characteristic, such as bisbenzocyclobutene (BCB) and perfluorocyclobutene (PFCB).

A semiconductor pattern 42 preferably made of amorphous silicon is formed on the gate insulating layer 30, and an ohmic contact layer pattern 55 and 56 preferably made of amorphous silicon doped with impurity are formed on the semiconductor pattern 42.

A data wire 62, 64, 65 and 66 and a pixel wire 67 and 68 connected thereto are formed on the ohmic contact layer pattern 55 and 56. The data wire 62, 64, 65 and 66 and the pixel wire 67 and 68 are preferably made of a low resistivity metallic material bearing good contact with semiconductor. The data wire 62, 64, 65 and 66 includes a plurality of data lines 62 intersecting the gate lines 22 and extending in the longitudinal direction, a plurality of data pads 64 connected to one ends of the data lines 62 for receiving data signals from an external device to transmit to the data lines 62, a plurality of source electrodes 65 protruded from the data lines 62, and a plurality of drain electrodes 66 opposite the source electrodes 65. The pixel wire 67 and 68 includes a plurality of pixel electrode lines 67 connected to the drain electrodes 66 and extending parallel to the gate lines 22, and a plurality of pixel electrodes 68 connected to the pixel electrode lines 67 and extending in the longitudinal direction. The pixel electrodes 68 and the common electrodes 28 are arranged in an alternate manner.

Under the application of different voltages, the common wire 27 and 28 and the pixel wire 67 and 68, which are aligned parallel to each other on the insulating substrate 10, generate horizontal electric field therebetween. The driving of liquid crystal with the horizontal electric field realizes a wide viewing angle.

It is preferable that the data wire 62, 64, 65 and 66 and the pixel wire 67 and 68 are made of a low resistivity metallic material. Like the gate wire 22, 24 and 26, the data wire 62, 64, 65 and 66 has either a single-layered structure or a double-layered structure. The single-layered structure preferably includes Cr, Cr alloy, Mo, Mo alloy, Al, Al alloy, Ag, or Ag alloy. The double-layered structure includes one layer preferably made of a low resistivity metallic material, and the other layer preferably made of a material bearing a good contact characteristic with other materials.

The gate electrodes 26, the source electrodes 65, the drain electrodes 66, and portions of the semiconductor pattern 42 between the source and the drain electrodes 65 and 66 form TFTs.

The semiconductor pattern 42 has substantially the same planar shape as the data wire 62, 64, 65 and 66 and the pixel wire 67 and 68 except for the channel areas of the TFTs, i.e., the areas between the source and the drain electrodes 65 and 66. In detail, the semiconductor pattern 42 has the same planar shape as a pattern including the data lines 62, the data pads 64, the source electrodes 65, the drain electrodes 66, the pixel electrode lines 67 and the pixel electrodes 68 except that the semiconductor pattern 42 further includes portions defined as TFT channels located between the source and the drain electrodes 65 and 66.

The ohmic contact layer pattern 55 and 56 have a role of reducing the contact resistance between the underlying semiconductor pattern 42 and the overlying data wire 62, 64, 65 and 66 and pixel wire 67 and 68, and has the same planar shape as a pattern including the data wire 62, 64, 65 and 66 and the pixel wire 67 and 68. One portion 55 of the ohmic contact layer pattern 55 and 56 contacts the data line 62, the data pad 64 and the source electrode 65, which are integrated into one body. The other portion 56 of the ohmic contact layer pattern 55 and 56 contacts the drain electrode 66, the pixel electrode line 67 and the pixel electrode 68, which are also integrated into one body.

A passivation layer 70 preferably made of an organic insulating material is formed on the gate insulating layer 30. The passivation layer 70 covers the entire surface of the panel except for the gate pads 24 and the data pads 64. That is, the passivation layer 70 covers the data lines 62, the source electrodes 65, the drain electrodes 66, the pixel electrode lines 67, and the pixel electrodes 68. Therefore, the gate pads 24 and the data pads 64 are not covered by the passivation layer 70 to be exposed.

The dotted line indicated by the reference numeral 71 in FIG. 1 refers to the peripheral boundaries of the passivation layer 70. It is preferable that the gate insulating layer 30 is made of a low dielectric material exhibiting excellent flattening characteristic, such as BCB and PFCB.

As described above, the TFT array panel according to an embodiment of the present invention interposes an organic insulating layer having a relatively large thickness between the data lines and the gate lines to reduce the parasitic capacitance therebetween. Furthermore, the embodiment of the present invention gives an advantage that as wide viewing angle can be realized by driving the liquid crystal with horizontal electric field generated between the common electrode and the pixel electrode.

Now, a method of fabricating a TFT array panel according to an embodiment of the present invention will be now described in detail with reference to FIGS. 3A to 9 as well as FIGS. 1 and 2.

Figure 3A:
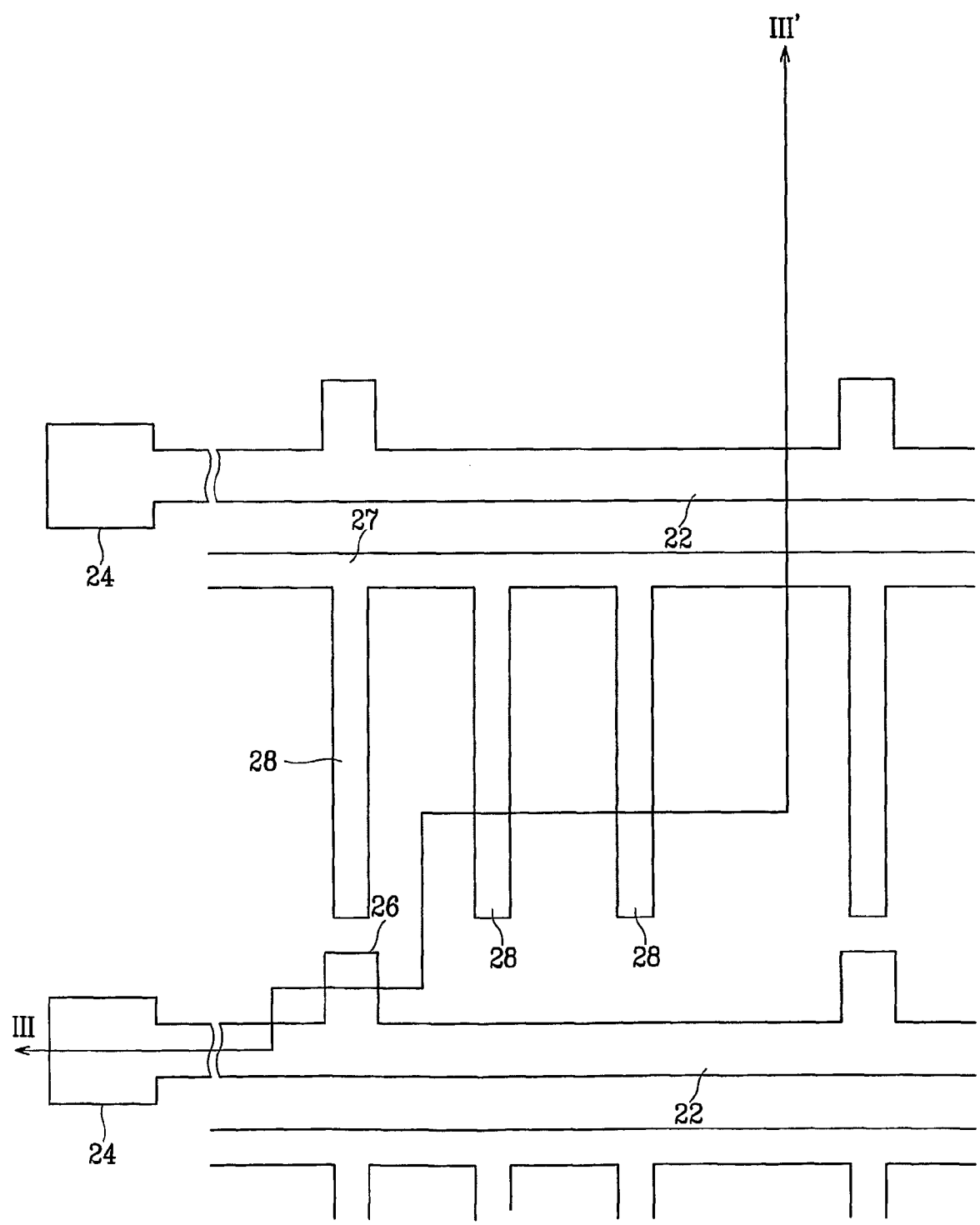
Figure 3B:
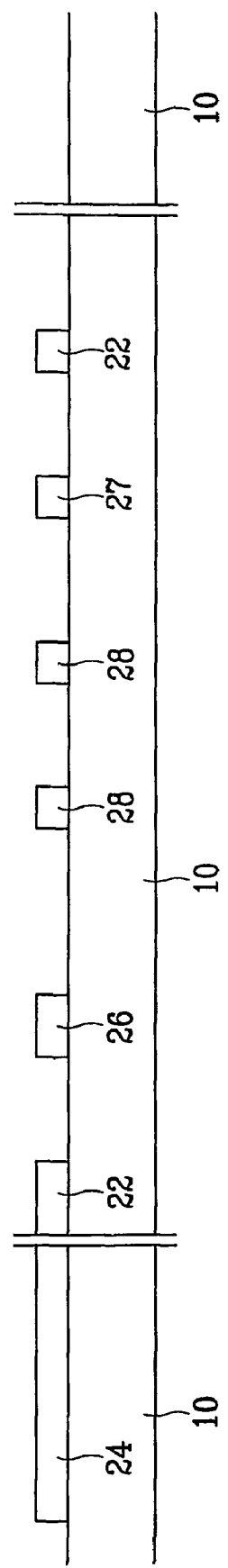

First, as shown in FIGS. 3A and 3B, a layer based on Cr, Cr alloy, Mo, Mo alloy, Al, Al alloy, Ag ox Ag alloy is deposited on an insulating substrate 10, and patterned by photo etch using a mask to form a gate wire 22, 24 and 26 including a plurality of gate lines 22, a plurality of gate pads 24 and a plurality of gate electrodes 26, and a common wire 27 and 28 including a plurality of common electrode lines 27 and a plurality of common electrodes 28.

Figure 4A:
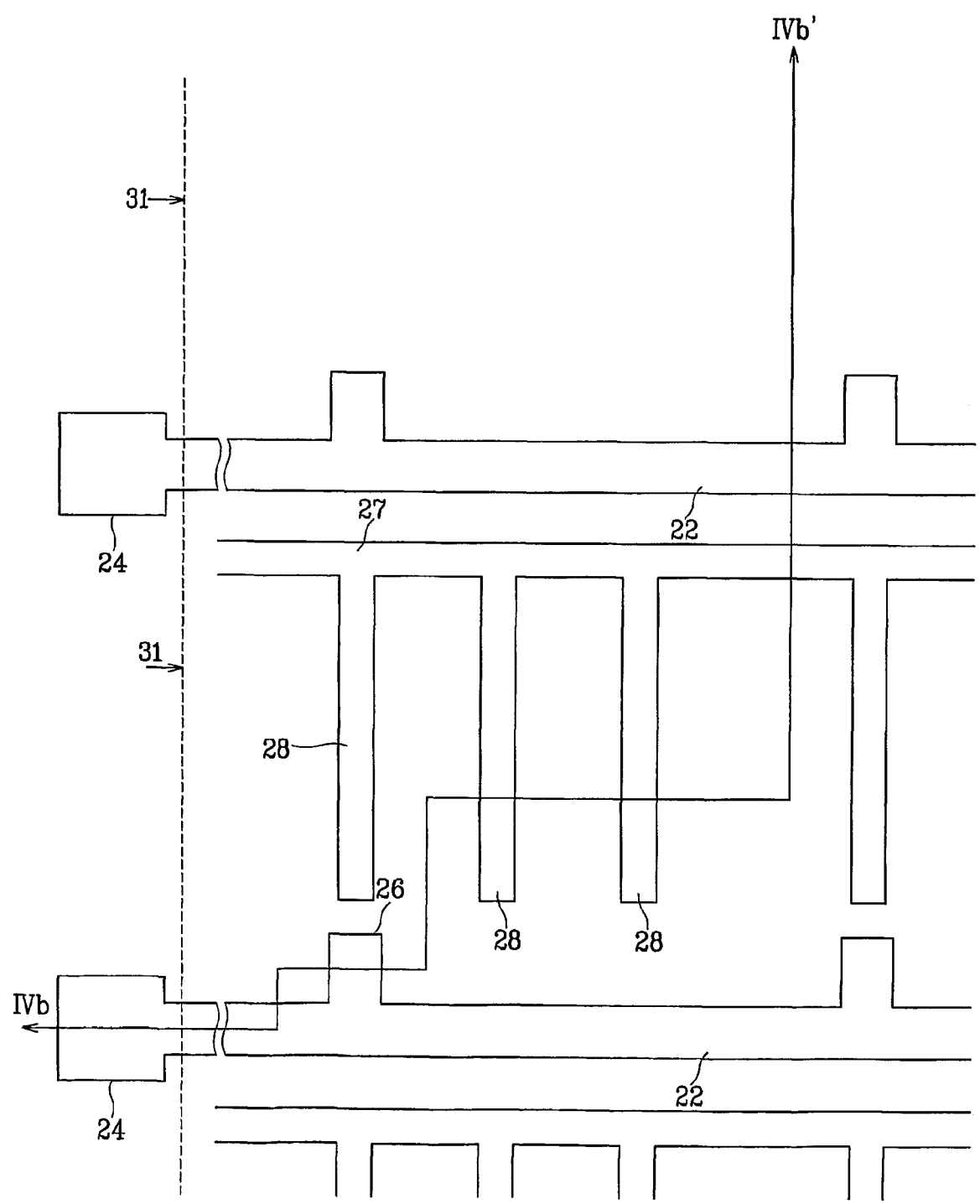
Figure 4B:
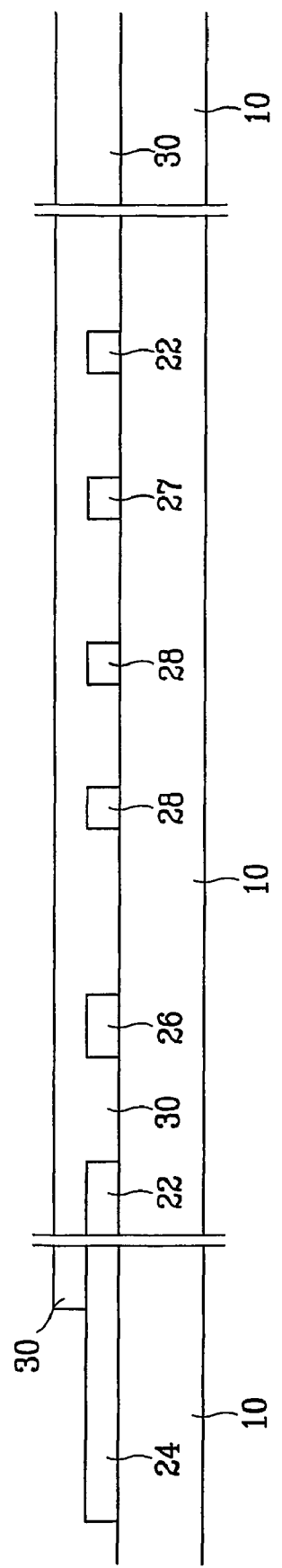

Thereafter, as shown in FIGS. 4A and 4B, a low dielectric organic insulating material such as BCB and PFCB is coated on the insulating substrate 10 provided with the gate wire 22, 24 and 26 and the common wire 27 and 28 by way of printing or slit coating, thereby forming a gate insulating layer 30. The gate insulating layer 30 may be planarized by way of grinding to improve the deposition and contact characteristics of the layers to be formed later. The slit coating utilizes a slit coater that coats an organic insulating material on the substrate 10 by spraying the organic insulating material with the frontal end of a slit nozzle with slit width of 0.1 mm or less.

The print of the organic insulating material on the substrate 10 is performed such that the gate insulating layer 30 does not cover the gate pads 24.

The dotted line indicated by the reference numeral 31 refers to the peripheral boundaries of the gate insulating layer 30.

Figure 5A:
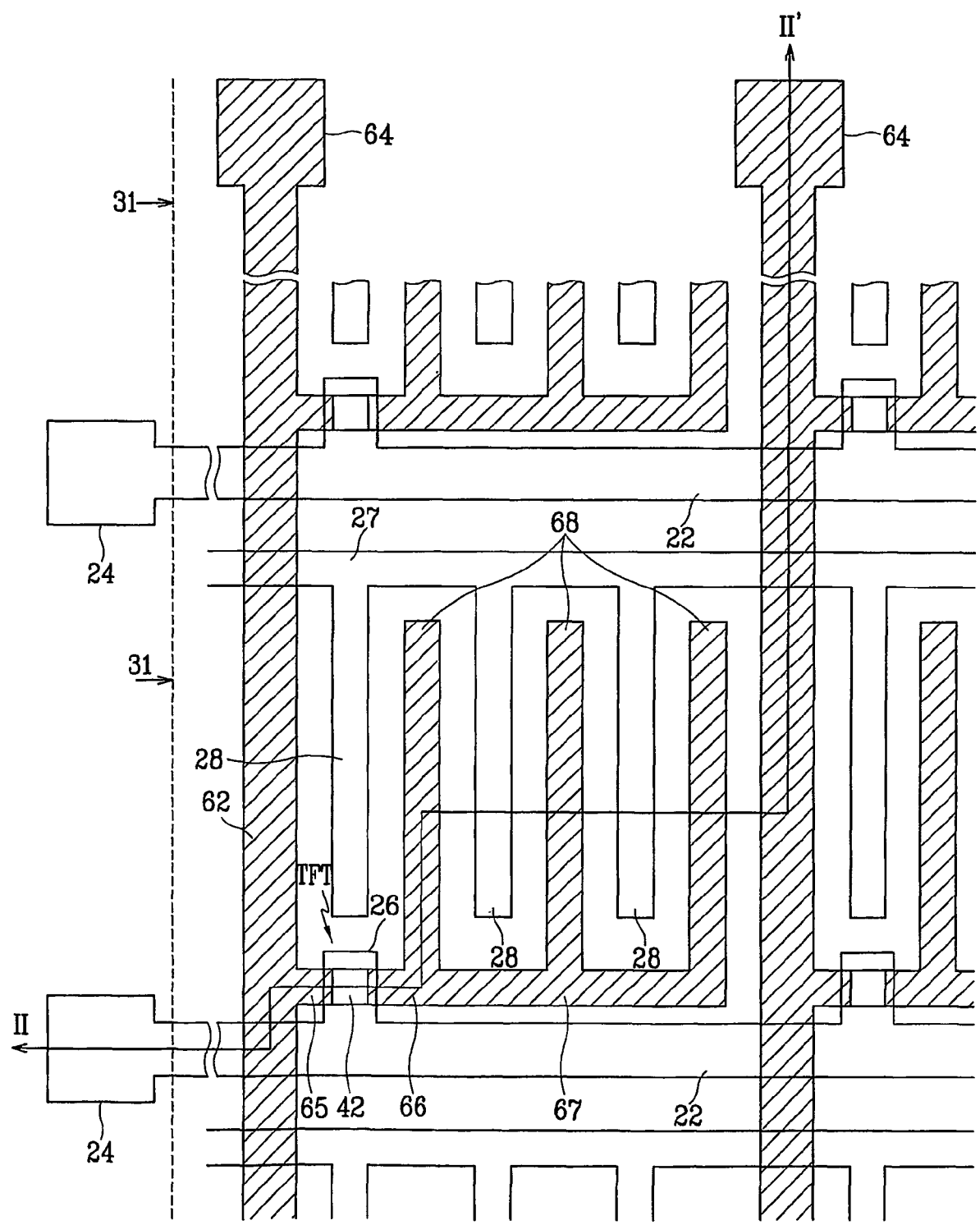
Figure 5B:
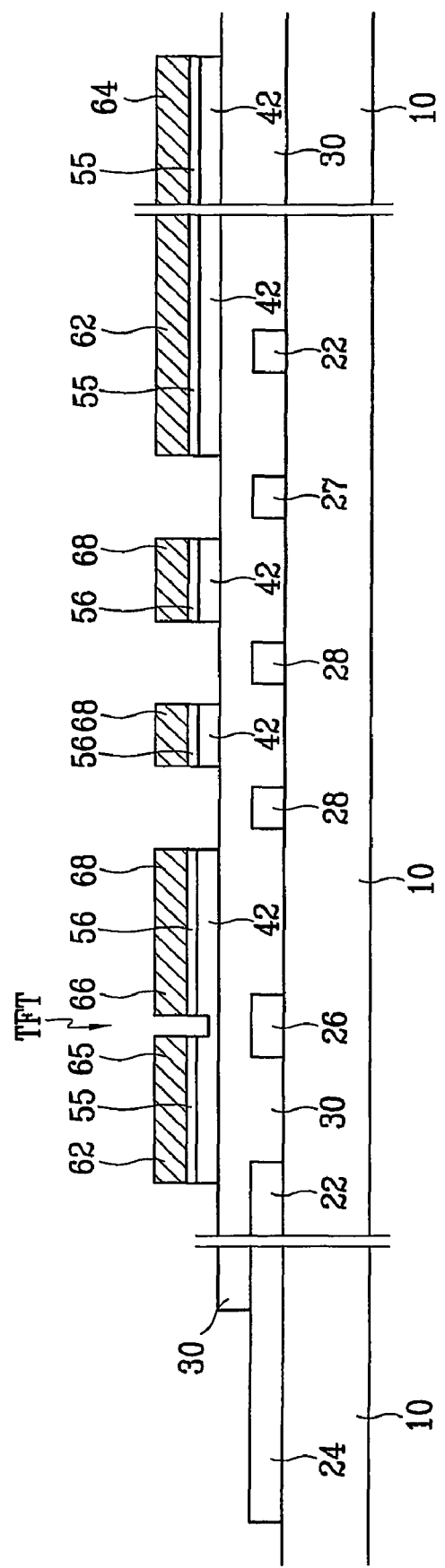

As shown in FIGS. 5A and 5B, a semiconductor layer, an impurities-doped semiconductor layer and a metallic layer are sequentially deposited on the gate insulating layer 30, and patterned by photo etch to form a semiconductor pattern 42, an ohmic contact layer pattern 55 and 56, and a metallic pattern including a data wire 62, 64, 65 and 66 and a pixel wire 67 and 68.

The data wire 62, 64, 65 and 66 and the pixel wire 67 and 68 contact the ohmic contact layer pattern 55 and 56 located thereunder and having the same planar shape thereas, and the ohmic contact layer pattern 55 and 56 contacts the semiconductor pattern 42 placed thereunder. The semiconductor pattern 42 has substantially the same planar shape as the data wire 62, 64, 65 and 66 but further includes areas defined as TFT channels located between the source and the drain electrodes 65 and 66.

The data wire 62, 64, 65 and 66, the ohmic contact layer pattern 55 and 56 and the semiconductor pattern 42 is alternatively formed using only one mask. This will be now described with reference to FIGS. 6 to 9.

Figure 6:
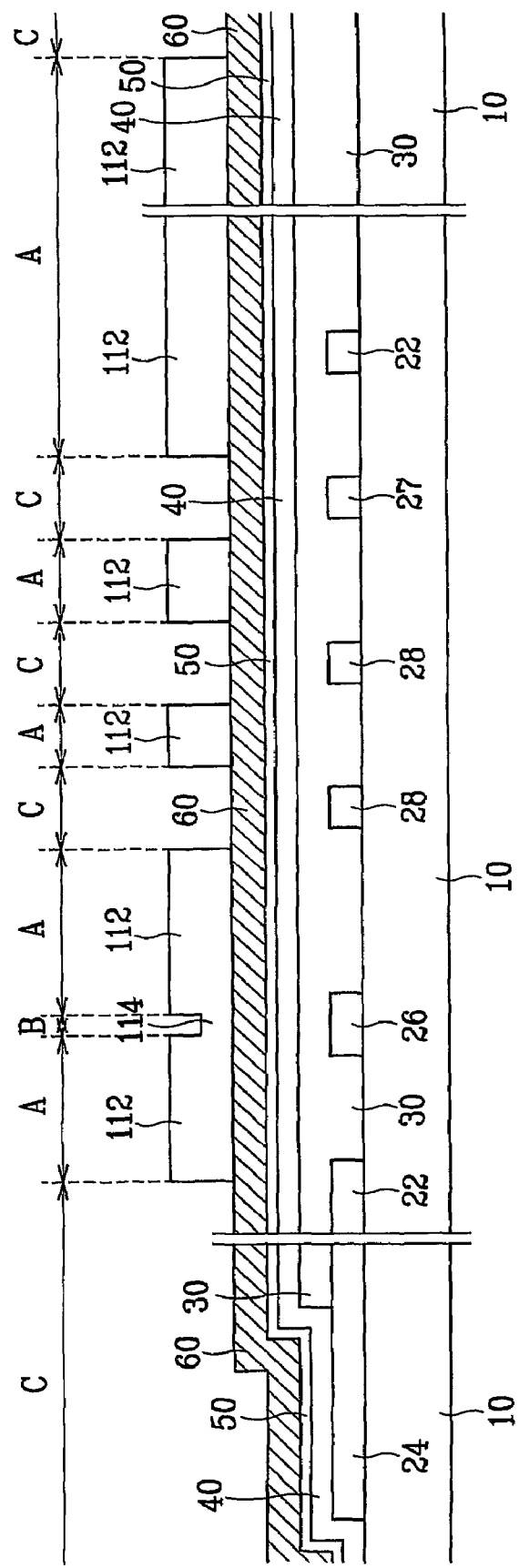

First, as shown in FIG. 6, a semiconductor layer 40 and a doped semiconductor layer 50 are sequentially deposited on the gate insulating layer 30 by chemical vapor deposition ("CVD"). Subsequently, a metal layer 60 made of Cr, Cr alloy, Mo, Mo alloy, Al, Al alloy, Ag, or Ag alloy is deposited by sputtering.

Next, after a photoresist film is coated on the metal layer 60 and exposed to light through a mask (not shown), the photoresist film is developed to obtain a photoresist pattern 112 and 114. The obtained photoresist pattern 112 and 114 is such that first portions 112 located on areas A for data wire and pixel wire (hereinafter referred to as "data areas" hereinafter) is thicker than second portions 114 located on channel areas B of TFTs between source and drain electrodes 65 and 66 and there is no residue on the remaining areas C. The thickness ratio of the second portions 114 to the first portions 112 is adjusted depending upon the etching conditions in the etching steps to be described later. It is preferable that the thickness of the second portions 114 is equal to or less than half of the thickness of the first portions 112.

The position-dependent thickness of the photoresist film is obtained by using a mask with position-dependent transmissivity. In order to adjust the amount of light exposure, a slit pattern, a lattice pattern or translucent films are provided on a mask. When using a slit pattern, it is preferable that the width of the portions between the slits or the distance between the portions, i.e., the width of the slits is smaller than the resolution of an exposer used for the photolithography. In case of using translucent films, thin films with different transmittances or with different thicknesses may be used to adjust the transmittance of the mask.

When the photoresistive film is irradiated with light through such a mask, polymers of the portions on the areas C directly exposed to the light are almost completely decomposed, and those of the portions on the areas B facing the slit pattern or the translucent films are not completely decomposed due to the small amount of light exposure. The polymers of the portions on the areas A blocked by light-blocking films are hardly decomposed. Here, it is required not to make the exposure time long enough to decompose all the molecules.

Development of the photoresistive film selectively exposed to light makes the portions having the polymers, which are not decomposed, to be left, and makes the middle portions exposed to the smaller light irradiation to be thinner than the portions which do not experience the light exposure.

Figure 7:
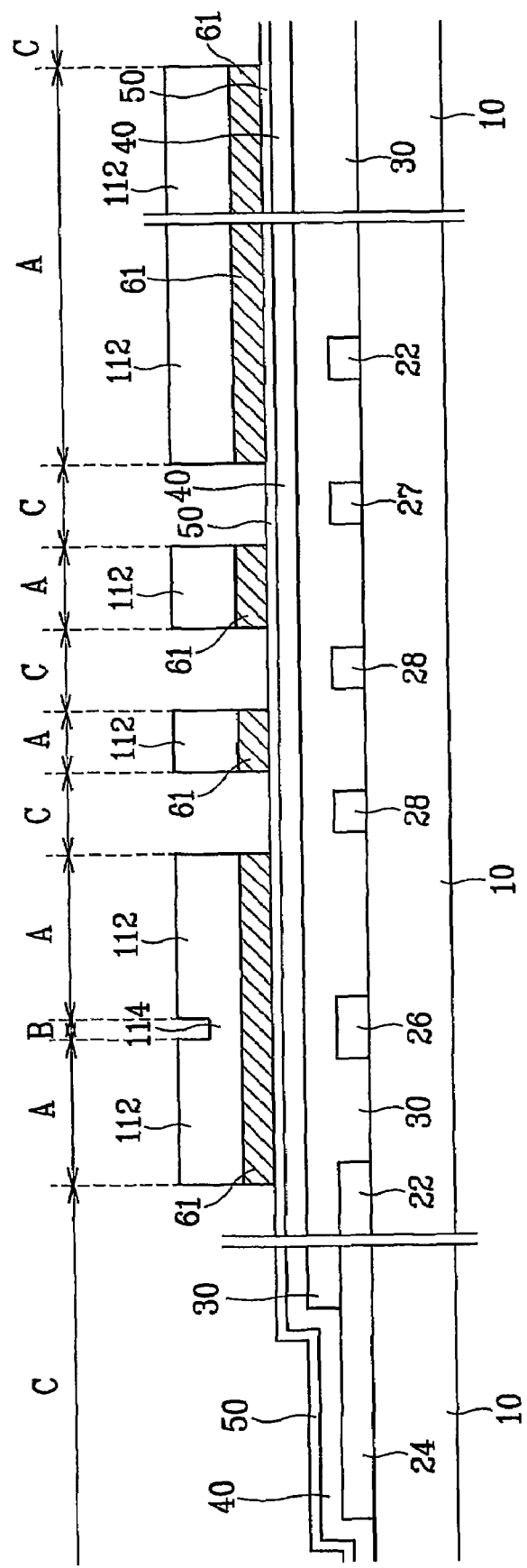

Subsequently, as shown in FIG. 7, the exposed portions of the metal layer 60 on the areas C are removed to expose the underlying portions of the doped semiconductor layer 50. Consequently, a metal pattern 61 on the channel areas B and the data areas A are left over, while portions of the metal layer 60 on the remaining areas C is removed out to expose the underlying portions of the doped semiconductor layer 50. The obtained metal pattern 61 is such that the source and the drain electrodes 65 and 66 are still connected without separation to incorporate the data wire and the pixel wire.

Figure 8:
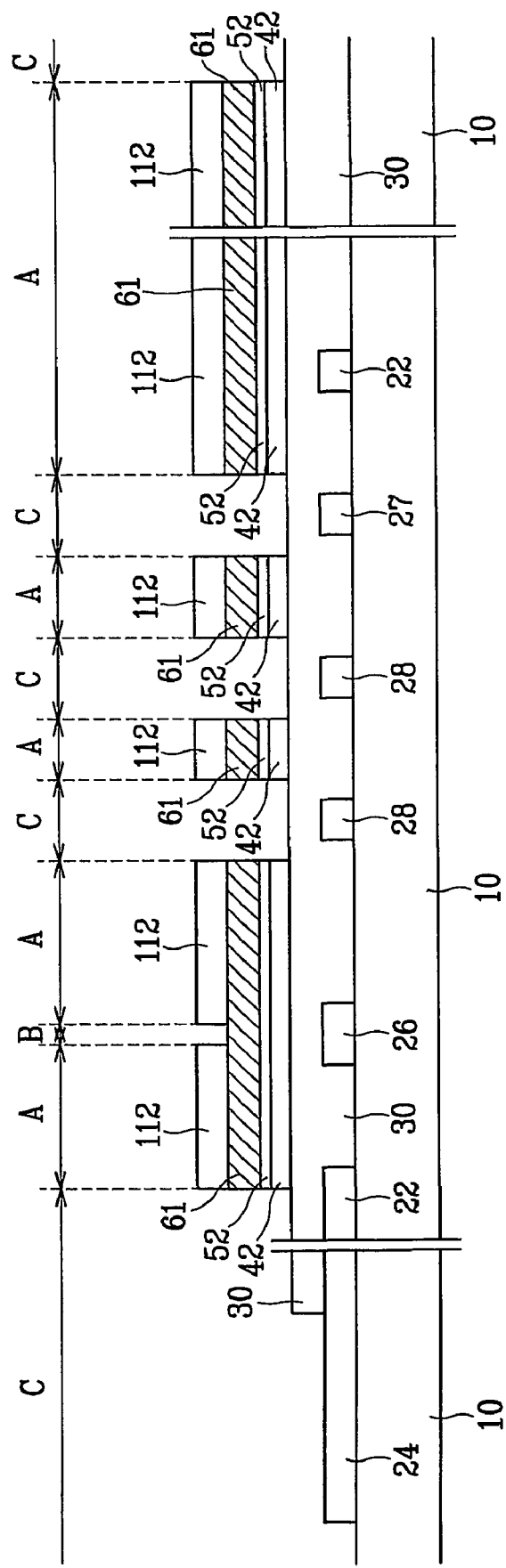

Next, as shown in FIG. 8, the exposed portions of the doped semiconductor layer 50 on the remaining areas C and the underlying portions of the semiconductor layer 40 are simultaneously removed by dry etching together with the second portions 114. The etch is preferably made under a condition that the photoresist pattern 112 and 114, the doped semiconductor layer 50 and the semiconductor layer 40 are simultaneously etched while the gate insulating layer 30 is not etched. Particularly, the etching ratios of the photoresist pattern 112 and 114 and the semiconductor layer 40 are preferably equal to each other. For example, a gas mixture of $SF_6$ and HCl or a gas mixture of $SF_6$ and $O_2$ etches the two layers to almost the same thickness.

For the equal etching ratios of the photoresist pattern 112 and 114 and the semiconductor layer 40, the thickness of the second photoresist portions 114 is preferably equal to or less than the sum of the thicknesses of the semiconductor layer 40 and the doped semiconductor layer 50.

In this way, the second photoresist portions 114 placed on the channel areas B are removed to expose the conductive pattern 61, and the portions of the doped semiconductor layer 50 and the semiconductor layer 40 on the remaining area C are removed to expose the underlying gate insulating layer 30. Meanwhile, the first photoresist pattern portions 112 on the data areas A are also etched to have reduced thickness.

In this step, the formation of a semiconductor pattern 42 is completed, and the ohmic contact layer pattern 52 with the same planar shape with the semiconductor pattern 42 is formed thereon.

Residue of the second photoresist portions 144 remained on the surface of the metal pattern 61 on the channel areas B is then removed by ashing.

Figure 9:
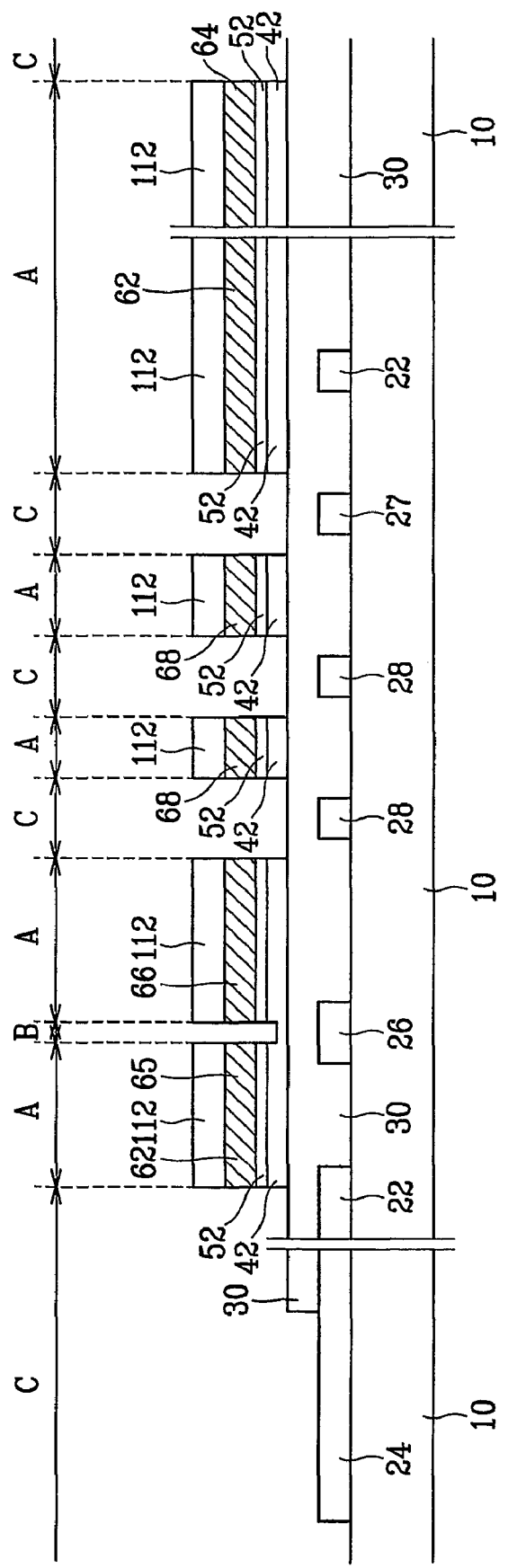

Subsequently, as shown in FIG. 9, the portions of the metal pattern 61 on the channel areas B and the underlying portions of the ohmic contact layer pattern 52 are etched using the remained second photoresist portions 112 as a mask. At this time, top portions of the semiconductor pattern 42 may be removed to cause thickness reduction, and the first photoresist portions 112 are etched to a predetermined thickness. The etching is performed under the condition that the gate insulating layer 30 is hardly etched, and it is preferable that the photoresist pattern is so thick to prevent the second photoresist portion 112 from being etched to expose the underlying metal pattern.

In this way, the source and the drain electrodes 65 and 66 in the metal pattern 61 are separated from each other. On the one hand, the data line 62, the data pad 64 and the source electrode 65 are formed with integrated into one body, and on the other, the drain electrode 66, the pixel electrode line 67 and the pixel electrode 68 are formed with integrated into one body. The formation of the underlying ohmic contact layer pattern 55 and 56 is also completed.

Removal of the remaining first photoresist pattern portion 112 completes a panel having a cross section shown in FIG. 5B.

Figure 2:
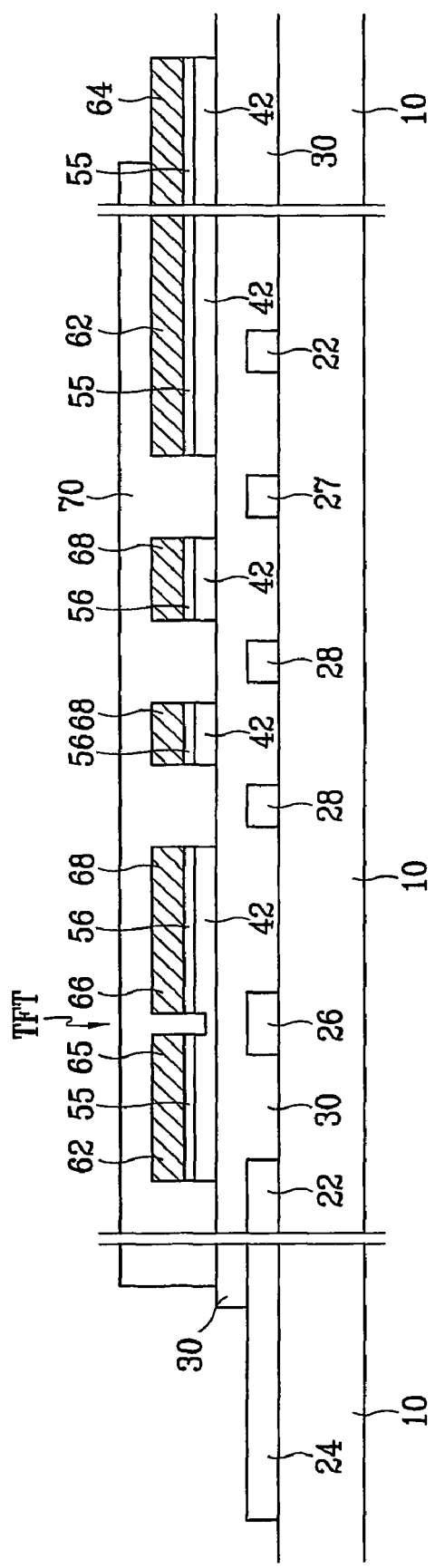

Thereafter, as shown in FIGS. 1 and 2, a low dielectric organic insulating material such as BCB and PFCB is coated on the panel provided with the data wire 62, 64, 65 and 66 and the pixel wire 67 and 68 by way of printing or slit coating, thereby forming a passivation layer 70. In order to prevent the passivation layer 70 from being formed on the gate pads 24 and the data pads 64, the printing plate is designed or the slit coating nozzle is controlled such that the passivation layer 70 does not cover the gate pads 24 and the data pads 64.

Since the TFT array panel manufactured by a method according to an embodiment of the present invention entirely exposes the gate and the data pads 24 and 64, it is not necessary to introduce subsidiary gate and data pads for reinforcing the contacts of the gate and the data pads 24 and 64 to external driving ICs.

The above-described inventive TFT array panel may include a common signal line electrically interconnecting a plurality of common electrode lines, and a common signal pad connected to the common signal line. This will be now described in detail with reference to FIGS. 10 and 11.

Figure 10:
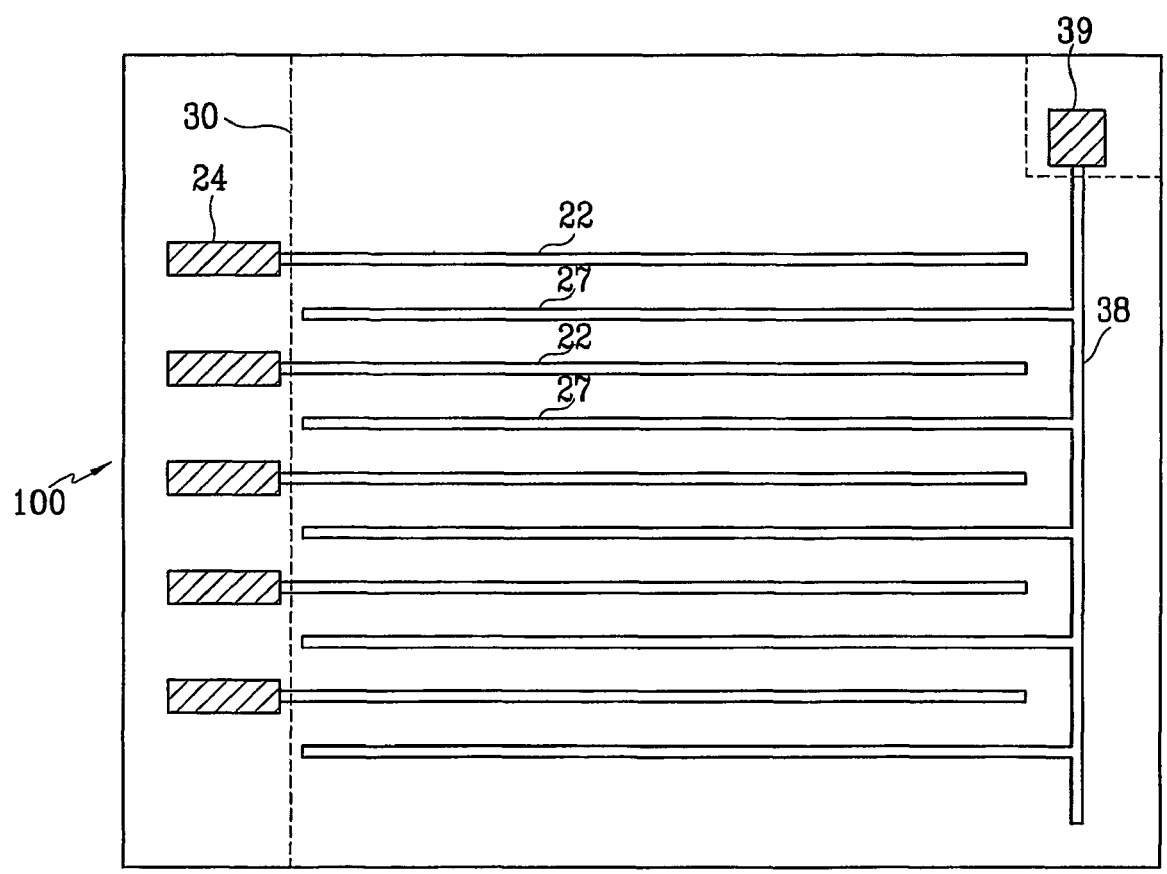
Figure 11:
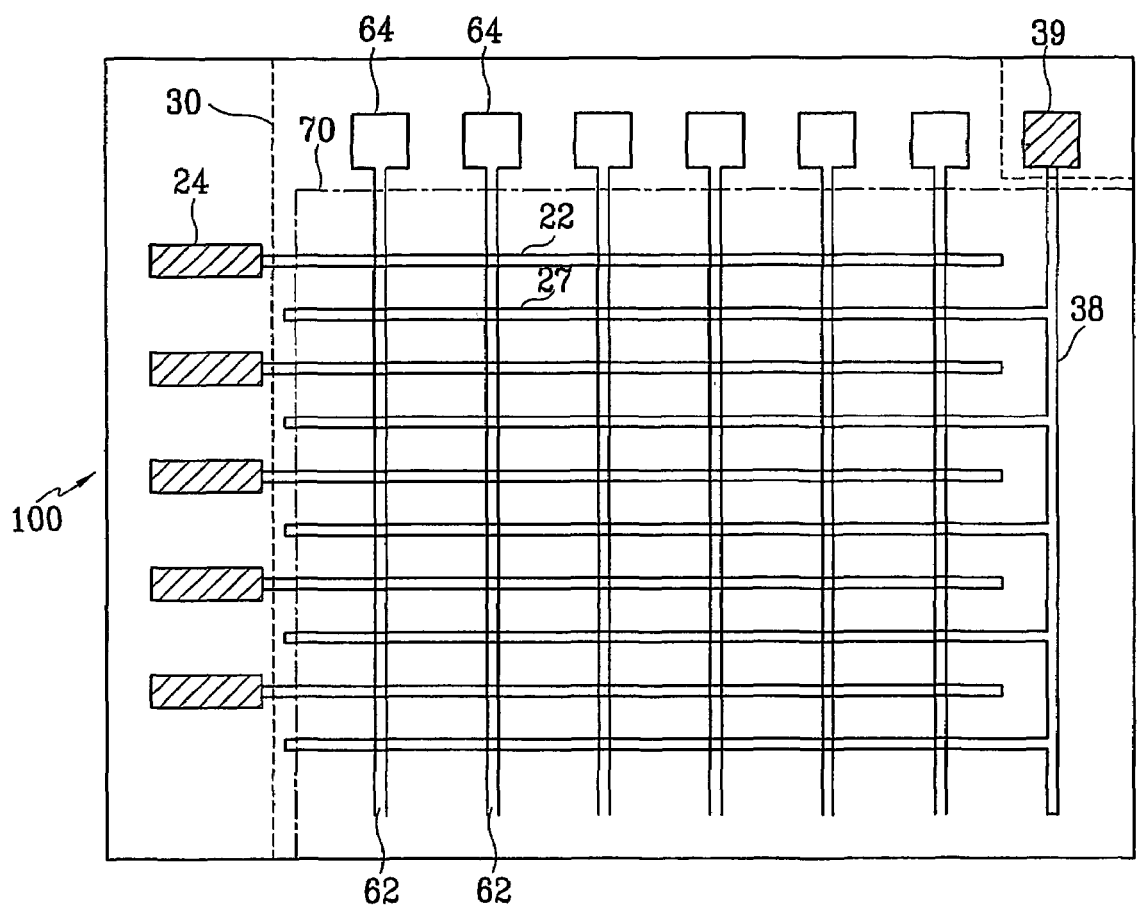

FIG. 10 illustrates a gate insulating pattern formed by the steps of fabricating a TFT array panel according to an embodiment of the present invention, and FIG. 11 illustrates a passivation layer pattern formed by the steps of fabricating a TFT array panel according to an embodiment of the present invention.

A plurality of gate lines 22 with a plurality of gate pads 24 connected to the one ends of the gate lines 22 and a plurality of common electrode lines 27 interposed between the gate lines 22 are provided on a inventive TFT array panel. The respective common electrode lines 27 are electrically connected to each other via a common line 38 extending in the longitudinal direction. A common electrode pad 39 for receiving common signals from an external device and transmit to the common signal line is provided at one end of the common signal line 38.

The gate insulating layer 30 is printed or coated on the panel 100 such that the gate pads 24 and the common electrode pad 39 are exposed as shown in FIG. 10.

Furthermore, a passivation layer 70 is printed or slit-coated on the panel 200 further provided by subsequent processes with the data wire 62, 64, 65 and 66 including a plurality of data lines 62 intersecting the gate lines 22 and a plurality of data pads 24 formed at one ends of the data lines 62 such that the data pads 64 as well as the gate pads 24 and the common electrode pads 39 added in the later processes are exposed as shown in FIG. 11.

In the inventive method of fabricating a TFT array panel, with the use of a printing technique or a slit coating technique, the pad areas are not covered by the gate insulating layer and the passivation layer to be exposed. This omits the step of forming contact holes at the gate insulating layer or the passivation layer to expose the pads.

The present invention prints or slit-coats a gate insulating layer and a passivation layer made of an organic insulating material such that gate pads and data pads are exposed, thereby simplifying a method of fabricating a TFT array panel, for example, reducing the number of masks.

What is claimed is:

1. A thin film transistor array panel comprising:
   an insulating substrate;
   a gate wire formed on the insulating substrate and including a gate line, and a gate pad connected to one end of the gate line;
   a gate insulating layer formed on the insulating substrate while exposing the gate pad and a portion of the gate line close to the gate pad;
   a semiconductor pattern formed on the gate insulating layer;
   a data wire formed on the gate insulating layer and including a data line intersecting the gate line, a source electrode projecting from the data line and contacting the semiconductor pattern, a drain electrode facing the source electrodes and contacting the semiconductor pattern, and a data pad connected to one end of the data line; and
   a passivation layer formed on the gate insulating layer while exposing the data pad and a portion-of the data line close to the data pad, wherein the passivation layer further exposes a portion of the gate insulating layer formed close to the gate pad, and wherein the passivation layer comprises organic material.

2. The thin film transistor array panel of claim 1 further comprising a common wire formed on the substrate and including a common electrode line parallel to the gate line, a common electrode connected to the common electrode line, and a common electrode pad connected to one end of the common electrode line, the gate insulating layer exposing the common electrode pad, and a portion of the common electrode line close to the common electrode pad.

3. The thin film transistor array panel of claim 1 or 2 wherein at least one of the gate insulating layer and the passivation layer is made of an organic insulating material.

4. The thin film transistor array panel of claim 1 wherein the semiconductor pattern having a thin portion disposed between the source electrode and the drain electrode, the thin portion being thinner than a portion of the semiconductor pattern contacting the source electrode and the drain electrode.

5. The thin film transistor array panel of claim 1 further comprising a pixel electrode line disposed substantially parallel to the gate line and connected to the drain electrode formed on the substrate, wherein the drain electrode is a projection from the pixel electrode line and is disposed substantially parallel to the gate line.

6. A thin film transistor array panel comprising:
   an insulating substrate;
   a gate wire formed on the insulating substrate and including a gate line, and a gate pad connected to one end of the gate line; a gate insulating layer formed on the insulating substrate while exposing the gate pad and a portion of the gate line close to the gate pad;
   a semiconductor pattern formed on the gate insulating layer;

a data wire formed on the gate insulating layer and including a data line intersecting the gate line, a source electrode connected to the data line and contacting the semiconductor pattern, a drain electrode facing the source electrodes and contacting the semiconductor pattern, and a data pad connected to one end of the data line;

a common wire formed on the substrate and including a common electrode line parallel to the gate line, a common electrode connected to the common electrode line, and a common electrode pad connected to one end of the common electrode line, the gate insulating layer exposing the common electrode pad, and a portion of the common electrode line close to the common electrode pad; and a passivation layer formed on the gate insulating layer while exposing the data pad and a portion of the data line close to the data pad wherein the passivation layer further exposes a portion of the gate insulating layer and an end portion of the common electrode line close to the gate pad.

7. The thin film transistor array panel of claim 6 further comprising a pixel electrode line disposed substantially parallel to the gate line and connected to the drain electrode formed on the substrate, wherein the drain electrode is a projection from the pixel electrode line and is disposed substantially parallel to the gate line.

* * * * *